(12) United States Patent
Kato et al.

(10) Patent No.: US 6,673,478 B2
(45) Date of Patent: Jan. 6, 2004

(54) CRYSTAL-GROWTH SUBSTRATE AND A ZNO-CONTAINING COMPOUND SEMICONDUCTOR DEVICE

(75) Inventors: Hiroyuki Kato, Tokyo (JP); Michihiro Sano, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/260,779

(22) Filed: Sep. 27, 2002

(65) Prior Publication Data

US 2003/0186088 A1 Oct. 2, 2003

(30) Foreign Application Priority Data

Mar. 26, 2002 (JP) ........................................ 2002-086247

(51) Int. Cl.[7] .............................. C30B 23/02; B32B 9/00
(52) U.S. Cl. ...................... 428/698; 428/689; 428/336; 428/697; 428/699; 428/701; 428/702; 117/2; 117/3; 117/84; 117/106; 117/944; 117/951
(58) Field of Search ................. 428/689, 697, 428/698, 699, 701, 702, 336; 117/944, 956, 951, 2, 84, 106, 3

(56) References Cited

U.S. PATENT DOCUMENTS

| | | | | | |
|---|---|---|---|---|---|
| 3,664,867 A | * | 5/1972 | Galli et al. | .................. | 428/336 |
| 5,585,648 A | * | 12/1996 | Tischler | ......................... | 257/77 |
| 5,815,520 A | * | 9/1998 | Furushima | ..................... | 372/45 |
| 6,030,886 A | * | 2/2000 | Yuri et al. | ................... | 438/493 |
| 6,291,258 B2 | * | 9/2001 | Kadota | ......................... | 438/46 |
| 6,423,983 B1 | * | 7/2002 | Narayan et al. | .............. | 257/96 |

* cited by examiner

*Primary Examiner*—Deborah Jones
*Assistant Examiner*—Stephen Stein
(74) *Attorney, Agent, or Firm*—Frishauf, Holtz, Goodman & Chick, P.C.

(57) ABSTRACT

In a method of growing a ZnO-containing compound semiconductor single crystal, on a compound single crystal layer of a hexagonal crystal structure having a plurality of (0001) surfaces aligned in a sequence of terraces along a direction of a-axis, a ZnO-containing compound single crystal of a hexagonal crystal structure is grown, having an inclination from the c-axis toward the direction of the a-axis.

20 Claims, 14 Drawing Sheets

CRYSTAL-GROWTH SUBSTRATE AND A ZNO-CONTAINING COMPOUND SEMICONDUCTOR DEVICE

CROSS REFERENCE TO RELATED APPLICATION

This application is based on Japanese Patent Application 2002-086247, filed on Mar. 26, 2002, the entire contents of which are incorporated herein by reference.

BACKGROUND OF THE INVENTION

A) Field of the Invention

This invention relates to a crystal-growth substrate adapted for growing zinc-oxide-containing (ZnO-containing) compound semiconductor crystal, a ZnO-containing compound semiconductor device and a manufacturing method of the ZnO-containing compound semiconductor crystal.

B) Description of the Related Art

A ZnO-containing compound semiconductor such as ZnO is one of wide band gap semiconductors, and its exciton binding energy is large as about 60 meV. A device with higher emission efficiency than a light emitting diode using a gallium nitride-containing (GaN-containing) compound semiconductor as an active layer material can be theoretically obtained by a light emitting diode using the ZnO-containing compound semiconductor as the active layer material.

Therefore, the ZnO-containing compound semiconductor is expected as an active layer material of a blue light emitting diode or an ultraviolet light emitting diode. In order to use the ZnO-containing compound semiconductor as the active layer material of the light emitting diode, at first, it is necessary to obtain a single crystalline layer of the compound semiconductor.

The single crystalline layer of the compound semiconductor is formed, for example, by a molecular beam epitaxy (MBE) method or by a laser ablation deposition method, on an a-cut (a-plane) sapphire substrate or a c-cut (c-plane) sapphire substrate directly or via a template layer.

The crystal structure of the ZnO-containing compound semiconductor is a wurtzite-type that is one of the hexagonal crystal structures, and the crystal growth on an a-cut sapphire substrate or a c-cut sapphire substrate usually takes place in the direction of −c axis (oxygen (O) surface). When, for example, a gallium (Ga) surface GaN film is used as a template layer, it is also possible to make the crystal growth of the ZnO-containing compound semiconductor carry out in the direction of +c axis (zinc (Zn) surface). Moreover, crystal growth can be carried out in the direction of +c axis on a Zn surface ZnO substrate.

In order to use ZnO-containing compound semiconductor as, for example, an active layer of a light emitting diode, it is desirable to obtain a single crystalline layer with less crystal defect. However, crystal defect tends to be produced in the single crystal of the ZnO-containing compound semiconductor.

SUMMARY OF THE INVENTION

It is an object of the present invention to provide a crystal-growth substrate adapted for a ZnO-containing compound semiconductor crystal by which a ZnO-containing compound semiconductor crystal with an improved crystallinity can be easily obtained.

It is another object of the present invention to provide a ZnO-containing compound semiconductor device with a ZnO-containing compound semiconductor single crystalline layer wherein the single crystalline layer with an improved crystallinity is easily obtained.

It is a further object of the present invention to provide a manufacturing method of the ZnO-containing compound semiconductor crystal by which a ZnO-containing compound semiconductor crystal with an improved crystallinity is easily obtained.

According to one aspect of the present invention, there is provided a growth substrate comprising a compound single crystal layer of a hexagonal crystal structure having a plurality of (0001) surfaces configured as a sequence of steps aligned along a direction of a-axis and adapted for growing, on said compound single crystal layer, a ZnO-containing compound semiconductor single crystal of a hexagonal crystal structure having a growing front surface declined toward the direction of the a-axis.

According to another aspect of the present invention, there is provided a ZnO-containing compound semiconductor device, comprising: a growth substrate comprising a compound single crystal layer of a hexagonal crystal structure having a plurality of (0001) surfaces aligned in a sequence of steps along a direction of a-axis; and a ZnO-containing compound semiconductor single crystal layer of a hexagonal crystal structure formed on said compound single crystal layer and having a growth front declined toward the direction of the a-axis.

According to further aspect of the present invention, there is provided a method of manufacturing a ZnO-containing compound semiconductor crystal, comprising the steps of: (a) preparing a crystal-growth substrate comprising a compound single crystal layer of a hexagonal crystal structure having a plurality of (0001) surfaces aligned in a sequence of steps along a direction of a-axis; and (b) growing a ZnO-containing compound semiconductor single crystal of a hexagonal crystal structure having a growing surface leaning toward the direction of the a-axis on said compound single crystal layer.

According to knowledge of the inventors of the present invention, it is desirable to grow up a ZnO-containing compound semiconductor in the direction of +c axis (Zn surface) in terms of improving crystallinity of the ZnO-containing compound semiconductor single crystal.

According to the above structure, it will become easy to obtain a ZnO-containing compound semiconductor crystal with improved crystallinity, and it becomes easy to improve performance of the semiconductor device using the ZnO-containing compound semiconductor single crystalline layer.

DETAILED DESCRIPTION OF THE PREFERRED EMBODIMENTS

Figure 1:
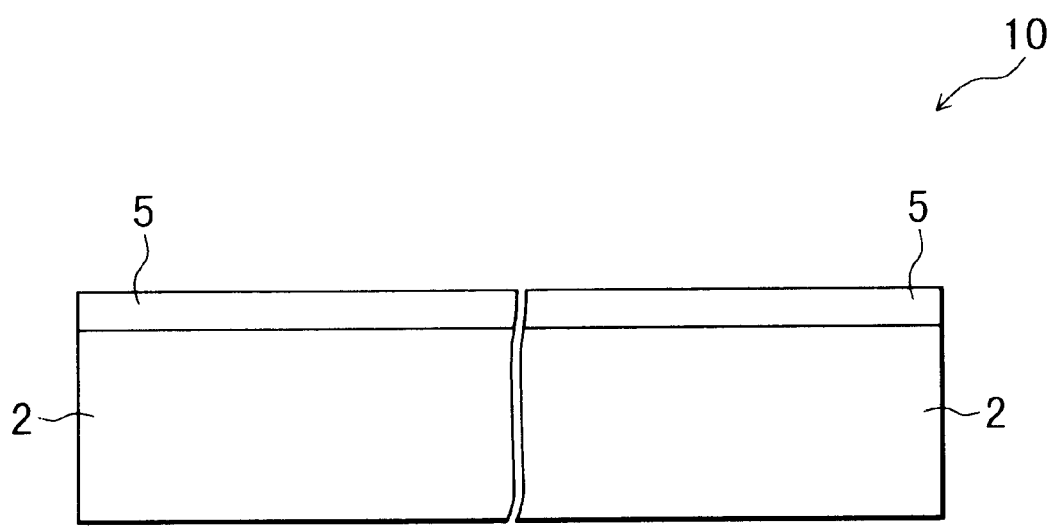
FIG. 1 is a schematic side view showing a crystal-growth substrate according to an embodiment of the present invention.

FIG. 1 schematically shows a crystal-growth substrate 10 for a ZnO-containing compound semiconductor. The crystal-growth substrate 10 contains a single crystalline sapphire ($\alpha$-Al$_2$O$_3$) substrate 2 (hereinafter called the sapphire substrate 2) having hexagonal crystal structure and a single crystalline gallium nitride layer 5 (hereinafter called the GaN layer 5) formed on the surface of the sapphire substrate 2.

Figure 2A:
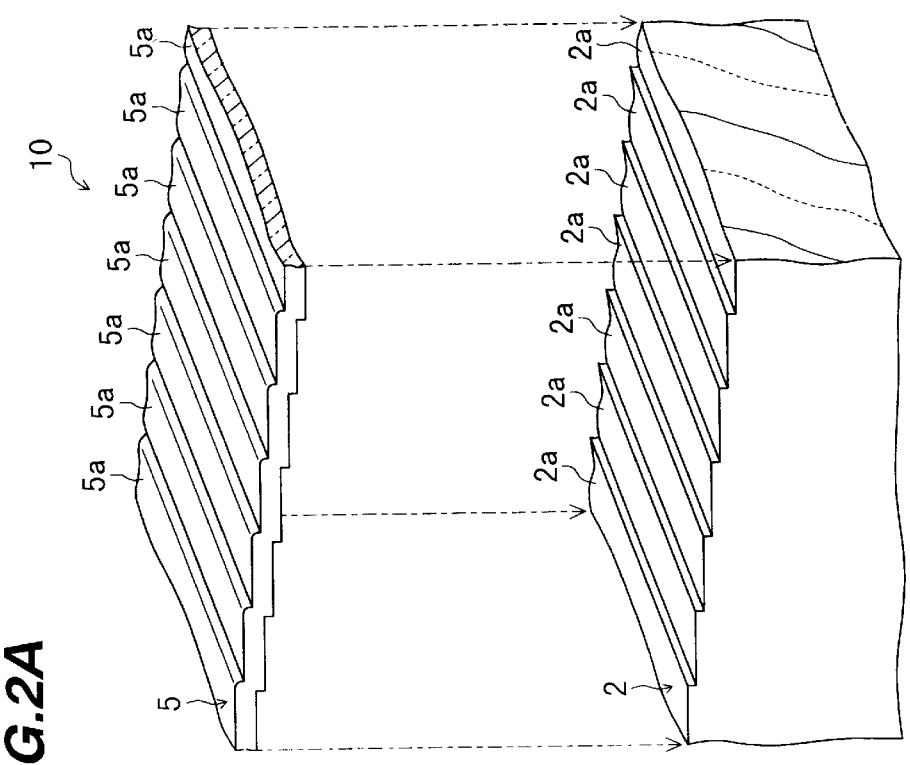
FIG. 2A is an enlarged decomposed perspective view showing a part of the crystal-growth substrate shown in FIG. 1.

A crystal structure of a single crystalline gallium nitride is wurtzite-type that is one of hexagonal-crystal structures, and the GaN layer 5 works as a template layer. FIG. 2A is an enlarged decomposed perspective view showing a part of the crystal-growth substrate 10 shown in FIG. 1.

Figure 2B:
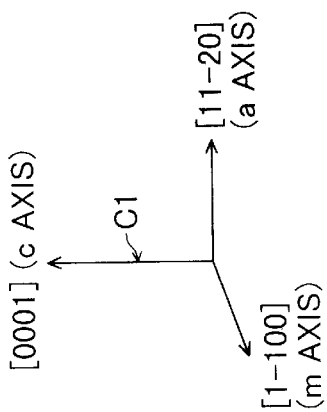
FIG. 2B is a diagram showing a coordinate system corresponding to directions of crystalline axes (a-axis, c-axis and m-axis) at a GaN layer in FIG. 2A.
Figure 2C:
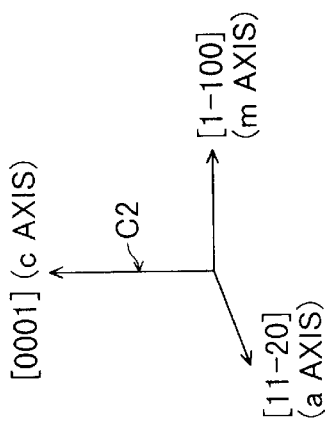
FIG. 2C is a diagram showing a coordinate system corresponding to directions of crystalline axes (a-axis, c-axis and m-axis) at the sapphire substrate in FIG. 2A.

A coordinate system C1 of FIG. 2B shows a direction of crystalline axes (a-axis, c-axis and m-axis) at the GaN layer 5 in FIG. 2A, and a coordinate system C2 of FIG. 2C shows a direction of crystalline axes (a-axis, c-axis and m-axis) at the sapphire substrate 2 in FIG. 2A.

In the both of the coordinate systems C1 and C2, c-axis indicated by Miller index [0001], m-axis indicated by Miller index [1–100] and a-axis indicated by Miller index [11–20] cross at right angles with each another.

Moreover, in notating Miller index, however it is a normal notational system for a negative value to add a "bar" on a numeral, in this specification and the drawings, numeral values with minus "–" are notated.

A crystal structure of the GaN layer 5 in FIG. 2A is a hexagonal structure that is the same as the sapphire substrate 2, and the c-axis of the GaN layer 5 extends to the same direction as the c-axis of the sapphire substrate 2, and the a-axis of the GaN layer 5 extends to the same direction as the m-axis of the sapphire substrate 2.

This GaN layer 5 is epitaxially grown in the direction of the +c-plane (Ga surface) on the sapphire substrate 2 and has a multiplicity of (0001) surfaces 5a aligned in a sequence along the direction of the a-axis (hereinafter each (0001) surface 5a will be called "the first terrace 5a") via steps.

A difference in height (steps) of one (0001) terrace 5a and the adjoining (0001) terrace 5a is preferably about one molecular thickness or two-molecular thickness. The one molecular thickness corresponds to a size of one molecule of GaN, i.e. about 0.26 nm. The two-molecular thickness corresponds to a size of two molecules of GaN, i.e. about 0.52 nm.

That kind of the GaN layer 5 is formed by, for example, metal organic chemical vapor deposition (MOCVD), molecular beam epitaxy (MBE), vapor phase epitaxy (VPE), etc.

A crystal-growth substrate 10 is formed of lattice mismatch materials such as the sapphire substrate 2 and the GaN layer 5. A film thickness of the GaN layer 5 is preferably selected in a range of 1 to 4 $\mu$m in general. When the film thickness is less than 1 $\mu$m, the lattice mis-match with the sapphire substrate 2 affects very much to tend to get worse the crystallinity. When the film thickness is more than 4 $\mu$m, manufacturing cost will increase.

An angle of inclination of the envelope of the first terraces 5a with each terrace surface of the first terrace 5a is selected to be about 0.5 degree or below and more preferably to be within a range of 0.1 to 0.3 degrees. When the angle of inclination of the surface (growth front) of the GaN layer 5 with each terrace surface of the first terrace 5a is out of the range between 0.1 to 0.3 degrees, surface morphology of the GaN layer 5 will be easy to be worsened.

The above-described angle of inclination of the GaN layer is adjustable by selecting the surface form of the sapphire substrate 2 that is a base of the GaN layer 5. The sapphire substrate 2 contains a multiplicity of (0001) surfaces 2a (herein after each (0001) surface 2a will be called "the second terrace") that are aligned in a sequence in the direction of its m-axis.

A difference in height (step) of the adjoining second terraces 2a is preferably about one molecular thickness or two-molecular thickness. The one molecular thickness corresponds to a size of one molecule of $\alpha$-Al$_2$O$_3$, i.e. about 0.22 nm. The two-molecular thickness corresponds to a size of two molecules of $\alpha$-Al$_2$O$_3$, i.e. about 0.44 nm.

An angle of inclination of an envelope of the second terraces 2a with each terrace surface of the second terrace is selected to make the angle of inclination be a predetermined value. The angle of inclination of the second terraces 2a is preferably the approximately same value, for example 0.1 to 0.3 degree, as the angle of the inclination of the GaN layer 5 to be formed thereon.

When the angles of inclination of the sapphire substrate 2 and the GaN layer 5 are out of the above-described relation, it becomes difficult to obtain a desired GaN layer 5 by an influence of the lattice mis-match.

The sapphire substrate 2 having the second step 2a can be formed by polishing, etching and annealing in an oxygen atmosphere to, for example, the sapphire substrate having a flat (0001) surface.

When the sapphire substrate 2 is formed by etching, for example, a mixture liquid ($H_3PO_4$: $H_2SO_4$=1:3) of phosphoric acid ($H_3PO_4$) and sulfuric acid ($H_2SO_4$) can be used as an etchant. The condition in this case can be, for example, 110 degrees Centigrade for 30 minutes.

When the sapphire substrate 2 is formed by annealing in the oxygen atmosphere, the condition can be provided, for example, 1000 degrees Centigrade for an hour. Crystal structures of the sapphire substrate 2 and the GaN layer 5 and each of the above-described angles of inclination can be confirmed by using, for example, X-ray diffraction.

The crystal-growth substrate 10 having the above-described structure is especially suitable for a growth substrate for growing the ZnO-containing compound semiconductor crystal. By using the GaN layer 5 as the template layer to grow the ZnO-containing compound crystal on the GaN layer, the ZnO-containing compound semiconductor having the improved crystallinity can be obtained. Therefore, a ZnO-containing compound semiconductor device with a ZnO-containing compound semiconductor single crystalline layer having an improved crystallinity can be obtained.

Figure 3B:
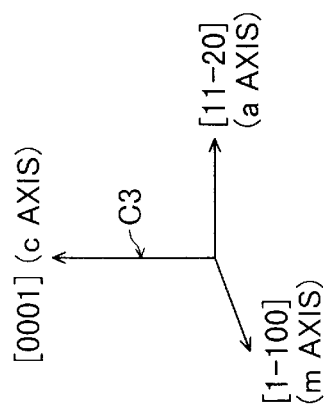
FIG. 3B is a diagram showing a coordinate system corresponding to directions of crystalline axes (a-axis, c-axis and m-axis) at the ZnO-containing compound semiconductor single crystalline layer in FIG. 3A.
Figure 3A:
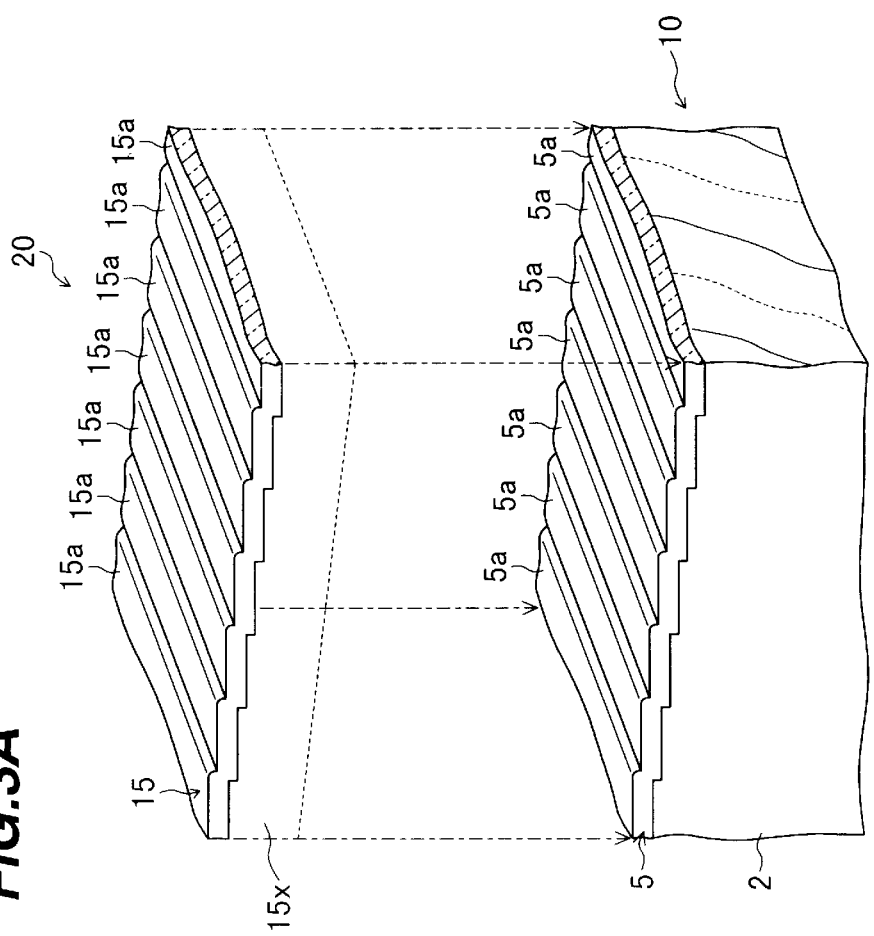
FIG. 3A is a decomposed perspective view schematically showing a substrate on which a semiconductor single crystalline layer is grown according to the embodiment of the present invention.

FIG. 3A is a decomposed perspective view schematically showing the ZnO-containing compound semiconductor device according to the embodiment of the present invention. The explanation is omitted for constituent elements similar to those in FIG. 2A by using similar reference symbols to those used in FIG. 2A. A ZnO layer 15 is grown on the growth substrate 10. A ZnO-containing compound semiconductor single crystalline layer containing ZnO may be grown instead of growing the ZnO layer.

A coordinate system C3 shown in FIG. 3B shows directions of crystalline axes (a-axis, c-axis and m-axis) at the ZnO-containing compound semiconductor single crystalline layer in FIG. 3A. In FIG. 3B, c-axis indicated by Miller index [0001], m-axis indicated by Miller index [1–100] and a-axis indicated by Miller index [11–20] cross at right angles one another.

As shown in FIG. 3A, a ZnO-containing compound semiconductor device 20 contains the growth substrate 10 described in the above and the ZnO-containing compound semiconductor single crystalline layer 15 (hereinafter called "the ZnO-containing single crystalline layer 15") formed on the GaN layer 5 of the growth substrate 10. In accordance with the necessity, a buffer layer 15x with a thickness of 10 to 40 nm which is formed by ZnO-containing compound semiconductor can be provided between the GaN layer 5 and the ZnO-containing single crystalline layer 15.

The m-axis and the a-axis of the ZnO-containing single crystalline layer 15 are parallel to the m-axis and the a-axis of the GaN layer 5 which is a template layer, and the c-axis is parallel to the c-axis of the GaN layer 5.

This ZnO-containing single crystalline layer 15 is grown in the +c-plane (Zn surface) on the GaN layer 5 and has a multiplicity of (0001) surfaces 15a (hereinafter each (0001) surface 15a will be called "the third terrace 15a") aligned in a sequence along the direction of the a-axis (the direction of a-axis on the ZnO-containing single crystalline layer) via steps.

A difference in height of the adjoining third terraces 15a is preferably about one molecular thickness or two-molecular thickness. The one molecular thickness corresponds to a size of one molecule of ZnO, i.e. about 0.26 nm. The two-molecular thickness corresponds to a size of two molecules of ZnO, i.e. about 0.52 nm.

An angle of inclination of the envelope of the third terrace 15a with each terrace surface of the third terrace 15a is selected to be about 0.5 degree or below and more preferably to be within a range of 0.1 to 0.3 degrees. This angle of inclination can be adjusted to select the angle of inclination of the base layer, that is the GaN layer 5. Crystal structure of the ZnO-containing single crystalline layer and the above-described angle of inclination can be confirmed, for example, by the X-ray diffraction.

As described in the above, a ZnO-containing single crystalline layer 15 having an improved crystallinity can be obtained by growing the ZnO-containing compound semiconductor on the GaN layer. Therefore, ZnO-containing compound semiconductor device 20 with a ZnO-containing compound semiconductor single crystalline layer 15 having an improved crystallinity can be obtained.

In the below, a manufacturing method of a ZnO-containing single crystalline layer 15 using the growth substrate 10 and a manufacturing method of a ZnO-containing compound semiconductor device 20 will be explained by taking a case that a zinc oxide (ZnO) single crystalline layer is formed by MBE (molecular beam epitaxy) as an example.

First, the growth substrate 10 described in the above is prepared, and the GaN layer 5 is degreased by cleansing with organic solvent such as methane chloride-containing cleaner (for example, Metaclean of the Tokuyama corporation, dichloromethan) acetone or the like.

The growth substrate 10 is equipped to a substrate holder in a MBE growth chamber, and the growth chamber is evacuated to less than, for example, $1 \times 10^{-7}$ Pa. The surface of the GaN layer 5 is cleaned by thermal process at about a temperature of 700 degrees Centigrade for 30minutes while irradiating atomic hydrogen onto the GaN layer 5.

Next, the temperature of the substrate is brought down to 500 degrees centigrade or less (e.g. 350 degrees centigrade), zinc (Zn) beam (molecular beam of zinc) and oxygen (O) radical beam (molecular beam of oxygen radical) is irradiated on the GaN layer keeping the state described in the above. Then zinc oxide (ZnO) buffer layer with a thickness of about 10 to 40 nm is formed. The ZnO buffer layer as deposited is considered not to have good crystalline quality and to have rough surface because of lattice mismatch between ZnO and the substrate.

The irradiation of the Zn beam and the O radical beam is stopped once, and planarity of the surface of the ZnO buffer layer is improved. The improvement of the planarity can be made by, for example, conducting a heating process wherein the temperature of the substrate is raised up to about 700 degrees centigrade for a few minutes. It is considered that the planarity of the surface and the crystallinity of the buffer layer are improved.

After the temperature of the substrate is raised to, for example, about 650 degree Centigrade, the Zn beam and O radical beam are irradiated on the ZnO buffer layer at a same time for growing ZnO crystal in the direction of its +c-plane (zinc (Zn) surface) on the ZnO buffer layer. A ZnO single crystalline layer with an improved crystallinity is grown. By further performing necessary processes, a ZnO-containing compound semiconductor device having the ZnO single crystalline layer with an improved crystallinity can be obtained.

When the surface of the GaN layer 5 is oxidized, that is, when the GaN layer 5 is covered with a $Ga_2O_3$ film, the ZnO crystal is grown in a direction of a −c-plane (oxygen (O) surface) on this $Ga_2O_3$ film. For growing the ZnO crystal in the direction of the +c-plane (Zn surface), it is preferable to form the ZnO buffer layer at a low temperature as described in the above and thereby control the oxidation of the surface of the GaN layer 5.

In accordance with the above-described method, three kinds of ZnO single crystalline layers (hereinafter called "the first to third ZnO single crystalline layers") which are different from one another in crystallinity are formed on each growth substrate by using a RF plasma enhanced molecular beam epitaxy (RF-MBE) system.

Also, for a comparison, a ZnO single crystalline layer (hereinafter called "the ZnO single crystalline layer according to first reference example") was formed by using the growth substrate wherein a GaN layer (having no first terrace) is formed on a c-cut sapphire substrate confirmed by the X-ray diffraction to have a plane (having no inclination) c-cut. Further, for another comparison, a ZnO single crystalline layer (hereinafter called "the ZnO single crystalline layer according to second reference example") is formed by using a crystal-growth substrate wherein a GaN layer is formed on a c-cut sapphire substrate 0.2 degrees off toward a-axis. The GaN layer has an angle of inclination (an angle of a growing surface with respect to c-plane) of 0.2 degree along a direction of m-axis.

Table 1 shows, in the crystal-growth substrate used for forming the first to third ZnO single crystalline layers and the ZnO single crystalline layers according to the first and second reference examples, an orientation of each of first and second terraces, steps height between adjoining terraces, an inclination angle of envelope of the terraces with each terrace surface (c-plane), and a thickness of each GaN layer.

Table 2 shows, in a case of forming the first to third ZnO single crystalline layers and the ZnO single crystalline layers according to the first and second reference examples, growth conditions, an orientation of the third terrace of each ZnO single crystalline layers, a step height between adjoining third terraces, an inclination angle of envelope (growing surface) of the lower third terraces with respect to each third terrace surface, and a thickness of the ZnO single crystalline layer. All of these ZnO single crystalline layers are layers wherein ZnO crystal is grown in the direction of its +c-axis (Zn-surface).

TABLE 1

| | GROWTH SUBSTRATE | | | | | | |
|---|---|---|---|---|---|---|---|
| | SAPPHIRE SUBSTRATE | | | GALLIUM NITRIDE (GaN) LAYER | | | |
| | ALIGNMENT OF 2ND TERRACES | STEP HEIGHT (nm) | ANGLE OF INCLINATION (DEGREE) | ALIGNMENT OF 2ND TERRACES | STEP HEIGHT (nm) | ANGLE OF INCLINATION (DEGREE) | FILM THICKNESS (μm) |
| FIRST ZnO SINGLE CRYSTALLINE LAYER | DIRECTION OF M-AXIS | 0.22 | 0.1 | DIRECTION OF A-AXIS | 0.26 | 0.1 | 2.0 |
| SECOND ZnO SINGLE CRYSTALLINE LAYER | DIRECTION OF M-AXIS | 0.22 | 0.2 | DIRECTION OF A-AXIS | 0.26 | 0.2 | 2.0 |
| THIRD ZnO SINGLE CRYSTALLINE LAYER | DIRECTION OF M-AXIS | 0.22 | 0.5 | DIRECTION OF A-AXIS | 0.26 | 0.5 | 2.0 |
| ZnO SINGLE CRYSTALLINE LAYER (1ST REF. EXAMPLE) | — | — | N/A | — | — | N/A | 2.0 |
| ZnO SINGLE CRYSTALLINE LAYER (2nd REFERENCE EXAMPLE) | DIRECTION OF A-AXIS | 0.22 | 0.2 | DIRECTION OF M-AXIS | 0.26 | 0.2 | 2.0 |

TABLE 2

| | GROWTH CONDITION *1 | | | | ZnO SINGLE CRYSTALLINE LAYER | | | |
| --- | --- | --- | --- | --- | --- | --- | --- | --- |
| | GROWTH TEMP (° C.) | Zn FLOW RATE (nm/sec.) | O2 FLOW RATE (sccm/RF) | GROWTH TIME (HOUR) | ALIGNMENT OF 3RD TERRACES | STEP HEIGHT IN GRADE (nm) | ANGLE OF INCLINATION (DEGREE) | FILM THICKNESS ($\mu$m) |
| FIRST ZnO SINGLE CRYSTALLINE LAYER | 650 | 0.25 | 3 | 2 | DIRECTION OF A-AXIS | 0.26 | 0.1 | 0.8 |
| SECOND ZnO SINGLE CRYSTALLINE LAYER | 650 | 0.25 | 3 | 2 | DIRECTION OF A-AXIS | 0.26 | 0.2 | 1.1 |
| THIRD ZnO SINGLE CRYSTALLINE LAYER | 650 | 0.25 | 3 | 2 | DIRECTION OF A-AXIS | 0.26 | 0.5 | 1.0 |
| ZnO SINGLE CRYSTALLINE LAYER (1ST REF. EXAMPLE) | 650 | 0.25 | 3 | 2 | — | — | N/A | 1.2 |
| ZnO SINGLE CRYSTALLINE LAYER (2nd REFERENCE EXAMPLE) | 650 | 0.25 | 3 | 2 | DIRECTION OF M-AXIS | 0.26 | 0.2 | 1.1 |

*1 flow rate of Zn shows a flowing amount of zinc (Zn) beam represented by a growing speed of the grown layer, and flow rate of O$_2$ a flowing amount of oxygen gas for one oxygen radical gun. The RF-output of one oxygen radical gun is 300 W.

Figure 4:
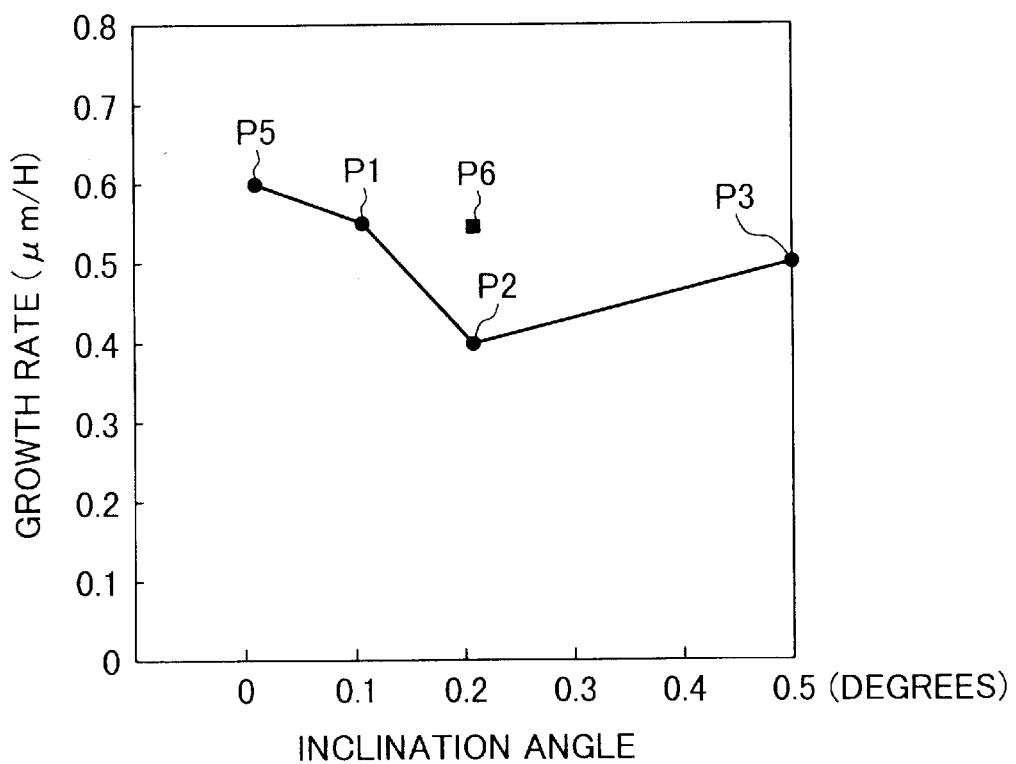
FIG. 4 is a graph showing growth rate of each of a first to a third sample ZnO single crystal layers and of a first to a second reference ZnO single crystal layers.

FIG. 4 shows dependency of the growth rate of ZnO single crystal layers on inclination angle according to the first to the third reference examples. The abscissa represents the inclination angle of the second terrace and hence the inclination angle of the first terrace of the growth substrate, and the ordinate represents a growth rate.

Plots P1 to P3 in the graph show the growth rates of the first to the third ZnO single crystalline layers. Plots P5 and P6 show the growth rates of ZnO single crystalline layers according to the first and the second reference examples.

Obviously from the comparison of the ZnO single crystalline layer P5 according to the first reference example and other ZnO single crystalline layers, when terraces are formed on the crystal-growth substrate, the growing speed of the ZnO single crystalline layer becomes slower than that in the case of not forming terraces. It is found that the growth rate of ZnO single crystalline layer has a tendency to be schematically slow as the inclination angle of the terrace is getting larger.

Also, obviously from the comparison of the ZnO single crystalline layer P6 according to the second reference example having an angle of inclination toward a direction of the m-axis and the second ZnO single crystalline layer having the same angle of inclination toward a direction of the a-axis, when terraces are formed on the crystal-growth substrate, the growing speed of the ZnO single crystalline layer is slower by configuring the terraces in the direction of the a-axis than in the direction of the m-axis.

In order to find the cause of the difference of the growing speed of the ZnO single crystalline layers, first, each surface of the ZnO single crystalline layers are evaluated by a reflection high energy electron diffraction (RHEED).

Figure 5A:
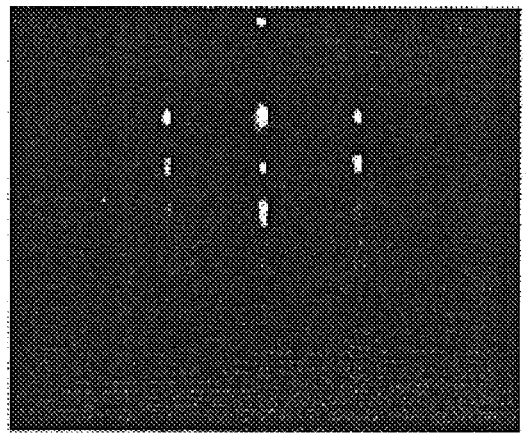
FIG. 5A is a reflection high energy electron diffraction (RHEED) pattern according to the first sample ZnO single crystal layer.
Figure 5B:
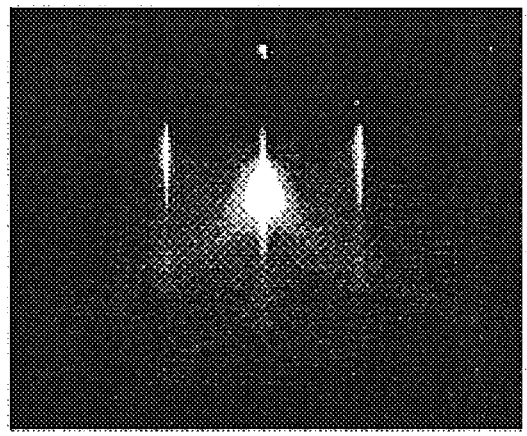
FIG. 5B is a RHEED pattern according to a second sample ZnO single crystal layer.
Figure 6A:
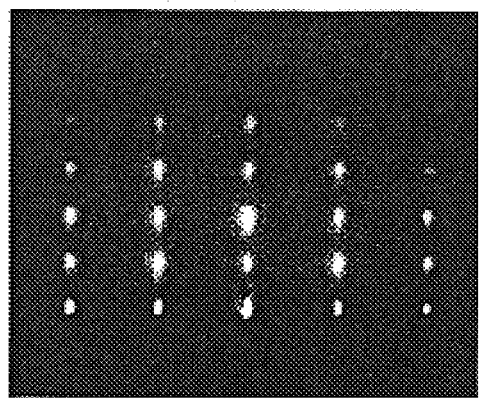
FIG. 6A is a reflection high energy electron diffraction (RHEED) pattern according to the first reference ZnO single crystal layer.
Figure 6B:
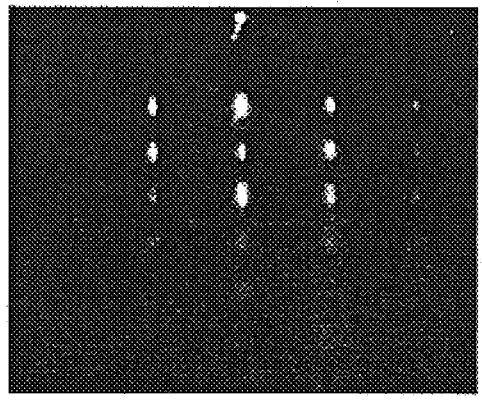
FIG. 6B is a RHEED pattern according to a second reference ZnO single crystal layer.

FIG. 5A shows a RHEED pattern of the first ZnO single crystalline layer, and FIG. 5B shows a RHEED pattern of the second ZnO single crystalline layer.

All of the diffraction patterns are obtained by using an electron beam with an accelerating voltage 20 kV. As shown in FIG. 5B, a pure streaky diffraction pattern is obtained from the second ZnO single crystalline layer. Therefore, it is considered that there is an atomic layer step on the surface of the ZnO single crystalline layer. A spotted diffraction pattern is obtained from the surface of other ZnO single crystalline layers. It is considered to be a gently uneven surface or a rough surface.

Figure 7A:
FIG. 7A is an atomic force micrograph (AFM) concerning to the first sample ZnO single crystalline layer.
Figure 7B:
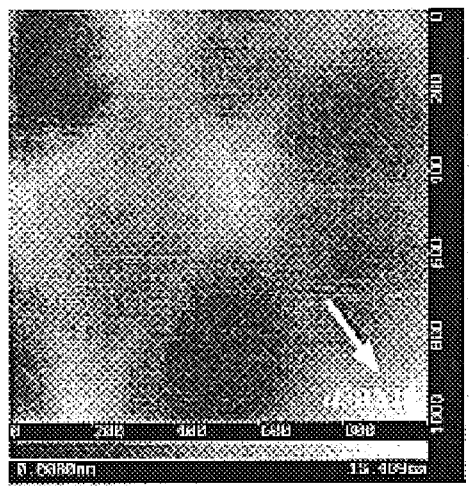
FIG. 7B is an AFM concerning to the second sample ZnO single crystalline layer.

In order to confirm the surfaces of each ZnO single crystalline layers, the surfaces of the ZnO single crystalline layers are observed by an atomic force microscopy (AFM). FIG. 7A shows an AFM of the first ZnO single crystalline layer, and FIG. 7B shows an AFM of the second ZnO single crystalline layer.

Figure 8A:
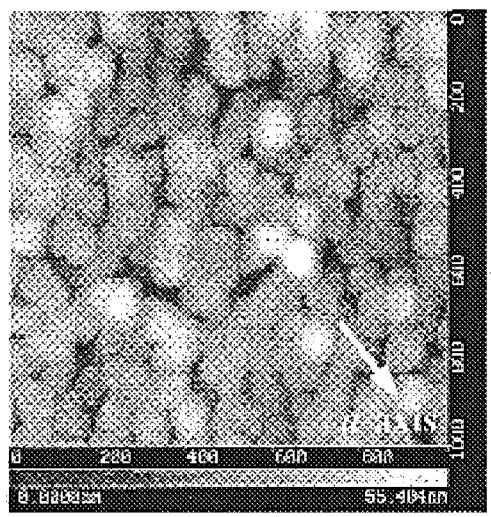
FIG. 8A is an AFM concerning to the first reference ZnO single crystalline layer.
Figure 8B:
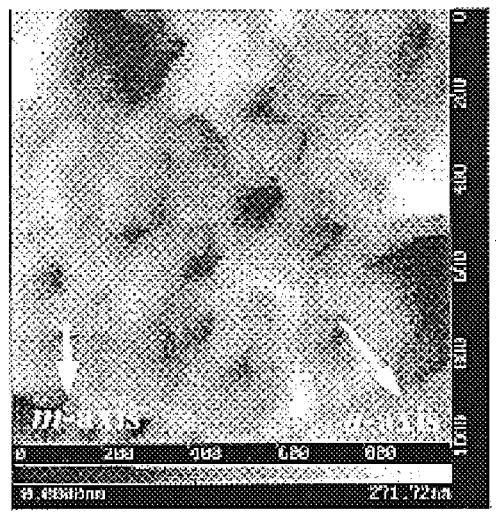
FIG. 8B is an AFM concerning to the second reference ZnO single crystalline layer.

FIG. 8A shows an AFM of the ZnO single crystalline layer according to the first reference example, and FIG. 8B shows an AFM of the ZnO single crystalline layer according to the second reference example. Each picture shows a region of a size of 1×1 $\mu$m on the surface of the ZnO single crystalline layer. An outline arrow and "a-axis" indicated by the outline arrow represents the direction of the a-axis of the ZnO single crystalline layer in each drawing. An outline arrow and "m-axis" in FIG. 8B represents the direction of the m-axis of the ZnO single crystalline layer in FIG. 8B.

Obviously from the comparison of FIG. 7A to FIG. 7B and FIG. 8A to FIG. 8B, a grain size of each ZnO crystal of the first to second ZnO single crystalline layer is largely grown two-dimensionally in the (0001) surface (c-plane) whereas a grain size of each of the ZnO single crystalline layers according to the first to second reference examples is small because the growth of each ZnO crystal in the c-plane is small.

The difference of the growing speed of the ZnO single crystalline layer shown in FIG. 4 represents an amount of the growth on the c-plane of each ZnO single crystalline layer. Also, obviously from the comparison of the first ZnO single crystalline layer and the ZnO single crystalline layer according to the second reference example, even if the growing speed are same, when a multiplicity of the first terraces are formed to be aligned in the direction of a-axis on the growth substrate, the ZnO crystals are largely grown in the c-plane and their grain size will be large compared to the case that the multiplicity of the first terraces are aligned in the direction of the m-axis.

Crystalline qualities of the first and the second ZnO single crystalline layers and the ZnO single crystalline layers according to the first and the second reference examples are evaluated by photo-luminescence and X-ray diffraction.

Figure 9:
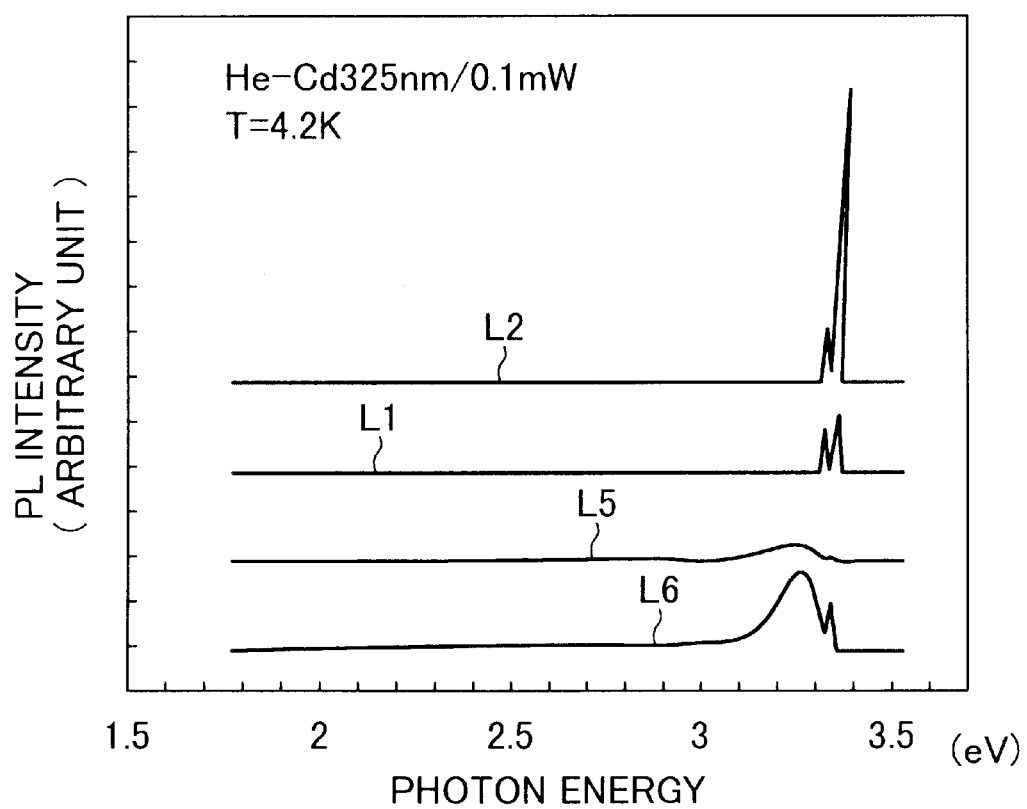
FIG. 9 is a graph showing a measured result of photoluminescence (PL) spectra according to the first and second sample ZnO single crystalline layers and the first and second reference ZnO single crystalline layers.

FIG. 9 shows a measured result of photo-luminescence spectra of the first and the second ZnO single crystalline layers and the ZnO single crystalline layers according to the first and the second reference examples.

In the figure, solid lines L1 and L2 represent photo-luminescence spectra of the first and second ZnO single crystalline layers, and solid lines L5 and L6 represent photo-luminescence spectra of the ZnO single crystalline layers according to the first and second reference examples.

Either one of spectra is obtained by using a laser light (wave length: 325 nm, output power: 0.1 mW) oscillated by the He—Cd$^+$ laser as an excitation light under a measuring temperature of 4.2 K.

As shown in FIG. 9, in the spectra obtained from the first and the second ZnO single crystalline layers, an intensity of exciton emission having energy of about 3.37 eV is strong, and the exciton emission is dominant. These ZnO single crystalline layers have less non-radiative recombination centers.

In the spectra L5 and L6 obtained from the ZnO single crystalline layers according to the first and the second reference examples, a broad band emission having a peak energy around about 3.25 eV is dominant. It is considered that the light emission is ascribed to crystal defect.

From the measured result by the PL, it is found that the first and the second ZnO single crystalline layers are formed with the ZnO single crystal having more improved crystallinity than that of the ZnO single crystalline layers according to the first and second reference examples.

Figure 10:
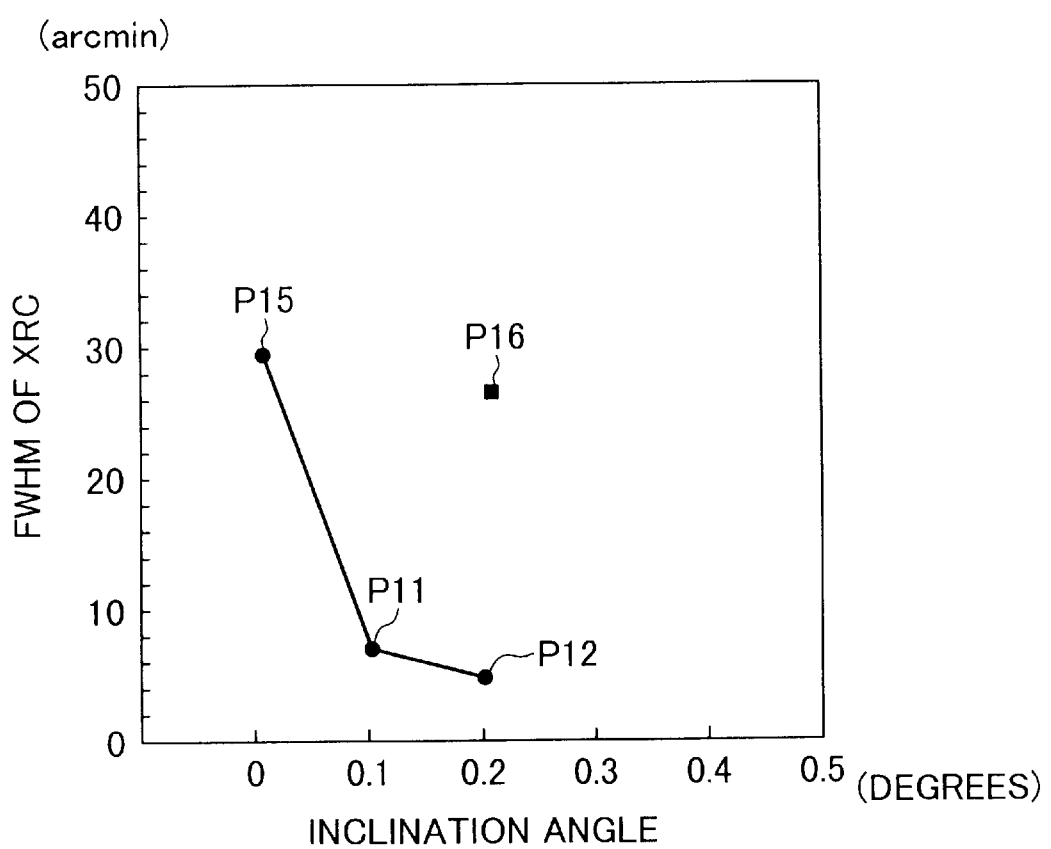
FIG. 10 is a graph showing a measured result of X-ray diffraction (XRD) for the first and second sample ZnO single crystalline layers and the first and second reference ZnO single crystalline layers.

FIG. 10 shows XRD results of the first and second ZnO single crystalline layers and the ZnO single crystalline layers of the first and second reference examples. The abscissa shows an angle of inclination of the second terrace of the used growth substrate (the sapphire substrate 2), and the ordinate shows a half width (full width at half maximum, FWHM) of an X-ray rocking curve (XRC).

In the figure, plots P11 and P12 represent the measured results of the first and second ZnO single crystalline layers, and plots P15 and P16 represent the measured results of the ZnO single crystalline layers according to the first and second reference examples.

As shown in FIG. 10, in the first and second ZnO single crystalline layers, the half width of the XRC is narrow, i.e., 8 arcmin or under. On the other hand, in the ZnO single crystalline layers according to the first and the second reference examples, the half width of the XRC exceeds 26 arcmin.

From those measured results, it is found that both of the first and the second ZnO single crystalline layers have highly improved crystalline qualities than the ZnO single crystalline layers according to the first and the second reference examples.

It is known that the ZnO single crystalline layer with an improved crystallinity can be obtained by growing the ZnO crystal in the direction of the +c-axis (Zn surface) on the GaN layer having terraces aligned in the direction of the a-axis.

Those measurement or evaluation results point out that it is important for improving the crystallinity of the ZnO single crystalline layer grown in the direction of the +c-axis (Zn surface) to grow the ZnO crystal enough on the c-plane. In the ZnO crystal grown in the direction of the +c-axis (Zn surface), a growing speed in the direction of the a-axis is faster than the growing speed in the direction of the m-axis. By forming a multiplicity of terraces aligned in the direction of the a-axis in the GaN layer that is a template layer, the ZnO crystal grown thereon is grown in the direction of the a-axis from the end of the terrace, and a position of the step becomes easy to be moved to the direction of the a-axis. As a result, it is considered that the ZnO crystal is also grown sufficiently in two-dimensions, and the crystallinity is improved.

Further, the third ZnO single crystalline layer is also considered from its growing speed that the ZnO crystal is largely grown two-dimensionally in the (0001) surface (c-plane) similar to the first and second ZnO single crystalline layers.

Although the examples for growing the ZnO single crystal on the growth substrate 10 using the sapphire substrate shown in FIG. 1 to FIG. 2 are described in the above, for example, a growth substrate made of the ZnO single crystal can be used for growing thereon the ZnO single crystal with an improved crystallinity instead of the growth substrate 10 using the sapphire substrate.

In this case, it is preferable to use a growth substrate formed of a ZnO single crystal having a hexagonal wurtzite-type crystal structure. In the ZnO single crystalline substrate, it is preferable to form a plurality of (0001) surfaces (hereinafter called "the fourth terrace") aligned in a sequence along the direction of the a-axis, for example, as the first terraces 5a shown in FIG. 2.

A step height at the adjoining fourth terraces is preferably about one molecular step or two-molecular step. The one molecular step corresponds to a size of one molecule of ZnO, i.e. about 0.26 nm. The two-molecular step corresponds to a size of two molecules of ZnO, i.e. about 0.52 nm.

An angle of inclination of the growth front (growing surface) with the terrace surface is preferably selected to be within a range of about 0.1 to 2.0 degrees and more preferably to be within a range of 0.1 to 1.0 degrees.

When the angle of inclination is under 0.1 degree, even if the above-described multiplicity of the fourth terraces, it will be difficult to grow the ZnO single crystal with an improved crystallinity thereon. On the other hand, when the angle of inclination is over 2.0 degree, the surface morphology of the ZnO single crystalline substrate will be worsened by the thermal cleaning (thermal process) generally performed before the growth of the ZnO single crystal, and it will be difficult to grow the ZnO single crystal with an improved crystallinity thereon. The angle of inclination is preferably selected to be especially in a range of 0.2 to 1.0 degrees.

The ZnO single crystalline substrate having plurality of the fourth terrace can be formed by polishing, etching and annealing in an oxygen atmosphere to, for example, the sapphire substrate having a flat (0001) surface.

When the fourth terrace is formed on the ZnO single crystalline substrate by annealing in an oxygen atmosphere, the annealing condition can be provided, for example, 1000 degrees centigrade for an hour.

Crystal structures and the angle of the ZnO single crystalline substrate and the angle of inclination described in the above can be confirmed using X-ray diffraction. A ZnO single crystalline substrate with an angle of inclination of 0.5 degree is prepared, and a ZnO single crystalline layer (hereafter called the fourth ZnO single crystalline layer) is formed on the plurality of fourth terraces on this ZnO single crystalline substrate in the same way as the case of forming the first or the second ZnO single crystalline layer described above.

For comparison, it was prepared a ZnO single crystalline substrate confirmed not to have an inclination in the growth front with the c-plane ((0001) surface) by the X-ray diffraction. On the ZnO substrate, the ZnO single crystalline layer (hereinafter called the ZnO single crystalline layer according to the third reference example) is similarly formed.

For the fourth ZnO single crystalline layer and the ZnO single crystalline layer according to the third reference example, the RHEED pattern is examined in the same condition as the above-described RHEED, and also AFM measurement of the surface was performed. In addition, the PL spectra are measured in the same condition as the above-described measurement of the PL spectra.

Figure 11A:
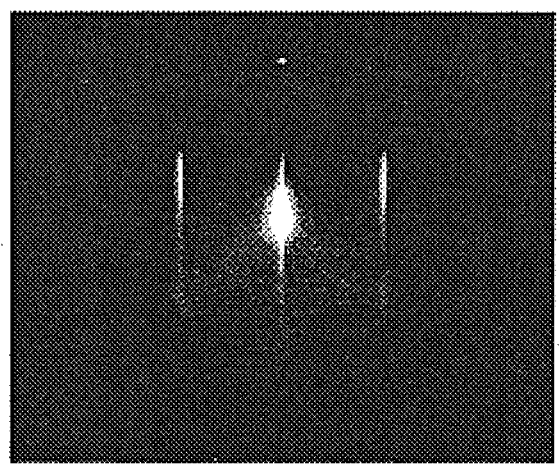
FIG. 11A is a RHEED pattern according to a fourth sample ZnO single crystalline layer.
Figure 11B:
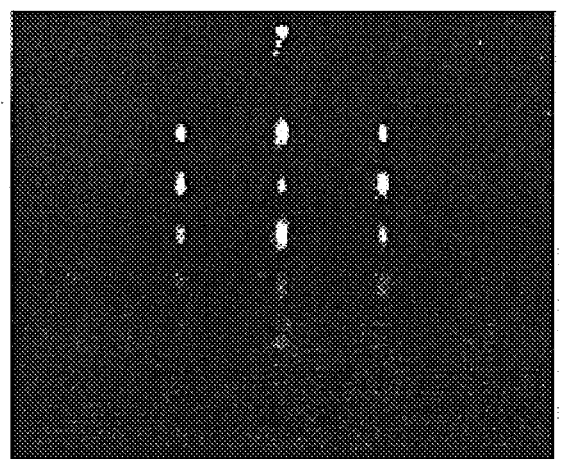
FIG. 11B is a RHEED pattern according to the third reference ZnO single crystalline layers.
Figure 12A:
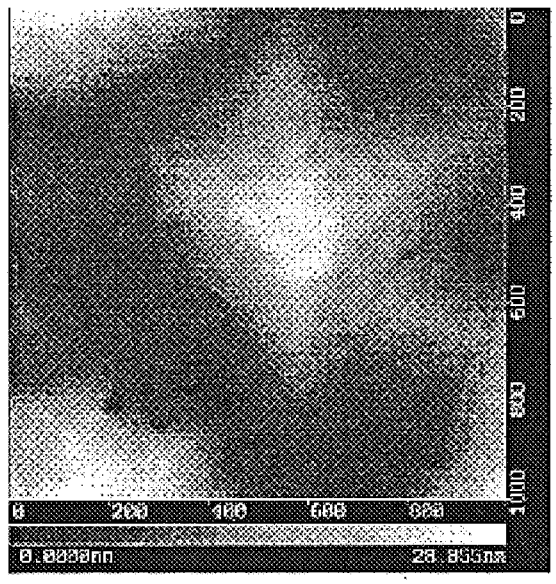
FIG. 12A is an AFM concerning to the fourth sample ZnO single crystalline layer.
Figure 12B:
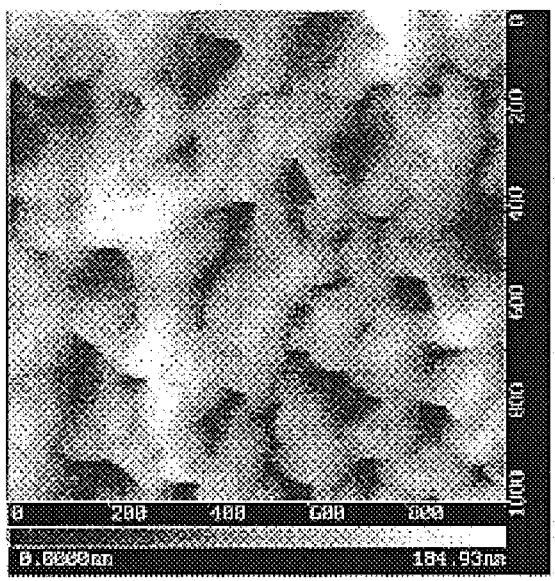
FIG. 12B is an AFM concerning to the third reference ZnO single crystalline layer.

FIG. 11A shows a RHEED pattern of the ZnO single crystalline layer according to a fourth ZnO single crystalline layer, and FIG. 11 B shows a RHEED pattern of the ZnO single crystalline layer according to the ZnO single crystalline layers of the third reference example. FIG. 12A shows an AFM of the fourth ZnO single crystalline layer, and FIG. 12B shows an AFM of the ZnO single crystalline layer according to the third reference example. These pictures show a region of 1×1 $\mu$m of the surface of the ZnO single crystalline layer.

Figure 13:
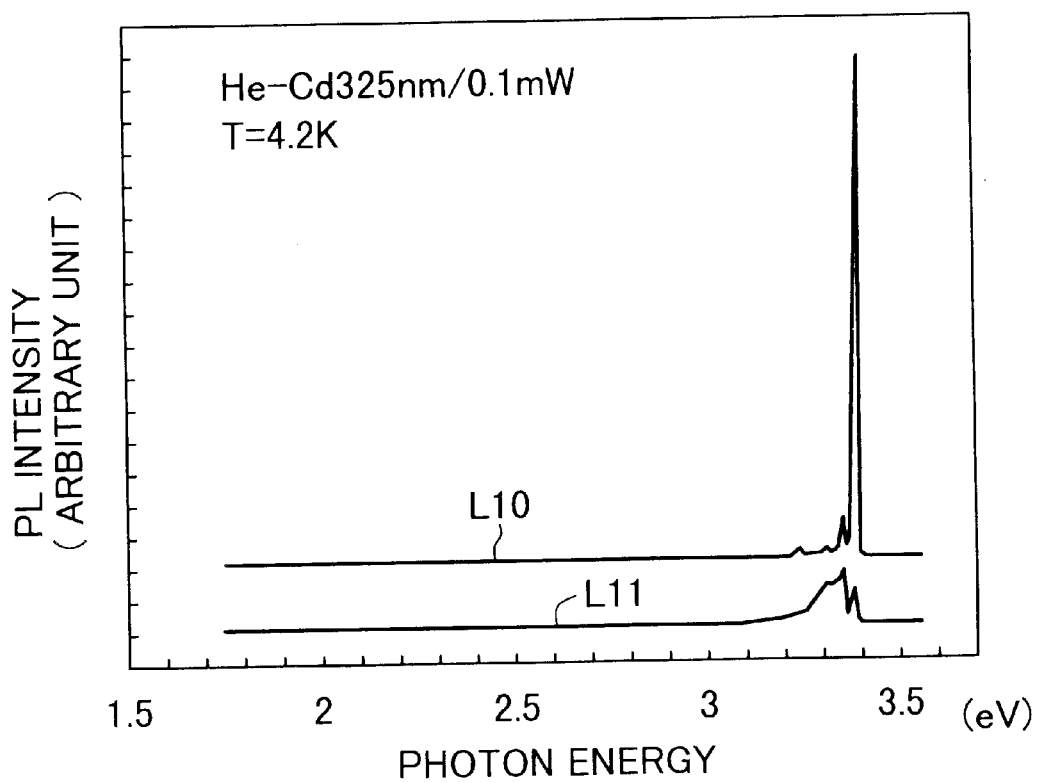
FIG. 13 is a graph showing a measured result of PL spectra according to the fourth sample ZnO single crystalline layer and the third reference ZnO single crystalline layer.

FIG. 13 shows measured results of PL spectra according to the fourth ZnO single crystalline layer and the ZnO single crystalline layer according to the third reference example. In the graph, a solid line L10 shows the measured result of PL spectrum of the fourth ZnO single crystalline layer, and a solid line L11 shows the measured result of PL spectrum of the third ZnO single crystalline layer Obviously from FIG. 11A to FIG. 13, when a ZnO single crystal is grown on a ZnO single crystalline substrate, a ZnO crystal having an improved crystallinity can be grown by forming the plurality of the fourth terraces aligned in the direction of a-axis on a ZnO single crystalline substrate in advance.

For the ZnO-containing compound semiconductor single crystalline layer with an improved crystallinity, it can be easy to improve the doping efficiency. By doping group III element such as gallium (Ga), aluminum (Al), etc., an n-type ZnO-containing compound semiconductor single crystalline layer can be obtained. Also, by doping nitrogen (N), sodium (Na) etc., a p-type ZnO-containing compound semiconductor single crystalline layer can be obtained. Even if nitrogen and gallium are co-doped, the p-type ZnO-containing compound semiconductor single crystalline layer can be obtained.

For example, by forming the n-type ZnO-containing compound semiconductor single crystalline layer and the p-type ZnO-containing compound semiconductor single crystalline layer to have a desired shape at a desired location, a ZnO-containing compound semiconductor device which works as a light emitting diode or the like can be obtained.

Figure 14:
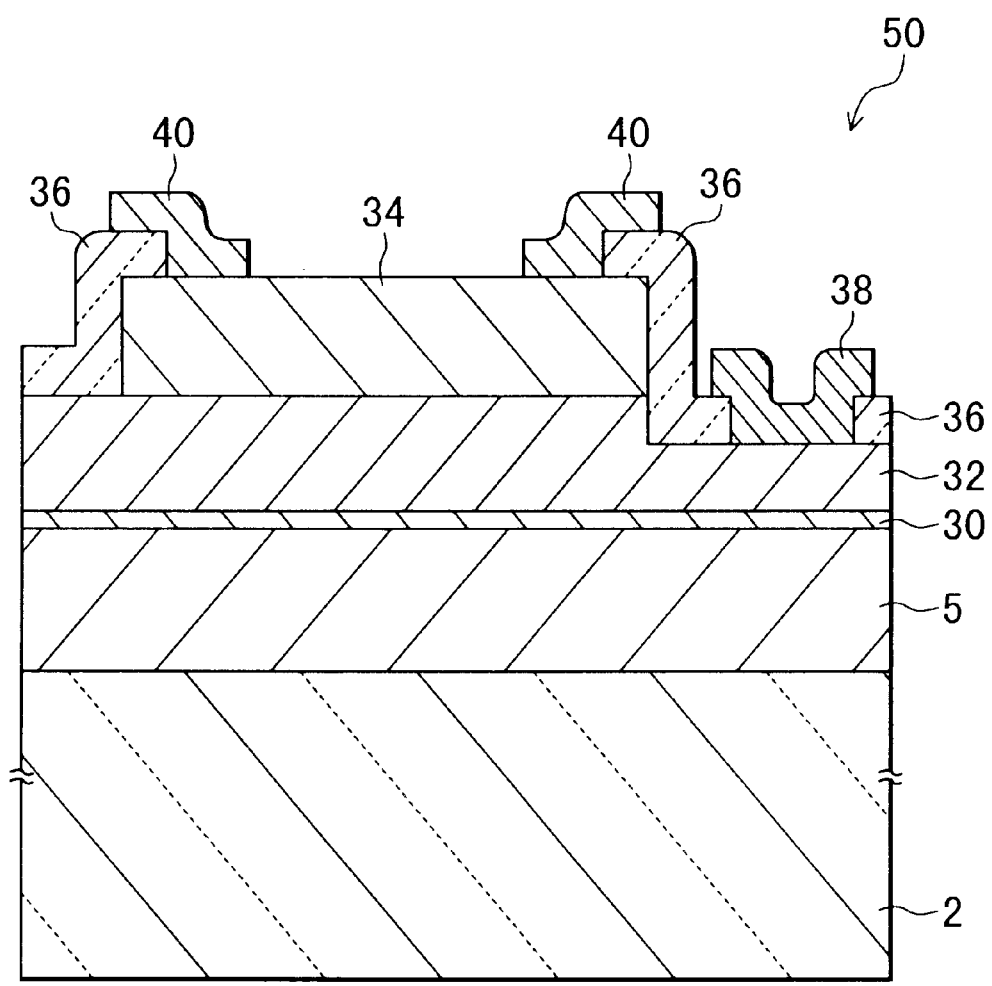
FIG. 14 is a schematic cross sectional view showing a ZnO-containing compound semiconductor device according to another embodiment of the present invention.

The ZnO-containing compound semiconductor device will be explained. FIG. 14 schematically shows a ZnO-containing compound semiconductor device 50 according to an embodiment of the present invention. Explanation for similar elements as shown in FIG. 2 is omitted by giving similar reference symbols.

In the semiconductor device 50 shown in FIG. 14, a buffer layer 30 is formed on the GaN layer 5, and thereon the n-type ZnO single crystalline layer 32 and the p-type ZnO single crystalline layer 34 are laminated in this order.

The buffer layer 30 is formed by the ZnO-containing compound semiconductor, for example, ZnO. The n-type ZnO single crystalline layer 32 is a ZnO single crystalline layer having a film thickness of about 0.5 to 2 $\mu$m and to which group III element such as gallium (Ga), aluminum (Al) or the like is doped at a concentration of about $10^{18}$cm$^{-3}$. Part of the n-type ZnO single crystalline layer 32 is removed. An electric insulating layer 36 formed of, for example, silicon nitride, and having an aperture in a central part is formed on a peripheral portion. A first electrode 38 is formed to fill the inside of the aperture.

In order to form ohmic-contact between the n-type ZnO single crystalline layer 32 and the first electrode 38, it is preferable that the first electrode 38 is formed by, for example, indium (In) and aluminum (Al).

A pn-junction is formed by forming, for example, a disc-shaped p-type ZnO single crystalline layer 34 having a thickness of 0.1 to 1 $\mu$m on the n-type ZnO single crystalline layer 32.

An edge and a periphery of the p-type ZnO single crystalline layer 34 are covered circularly in a plan view by the electric insulating film.

A circular second electrode 40 is formed on a peripheral region of the exposed surface of the p-type ZnO single crystalline layer 34 extending over the electric insulating film 38. For making ohmic-contact between the p-type ZnO single crystalline layer 34 and the second electrode 40, metal such as nickel (Ni), rhodium (Rh), platinum (Pt), palladium (Pd), gold (Au), etc., alloy of two or more of these metals, and a laminating film made by laminating thin films of two or more these metals are preferably used for forming the second electrode 40.

In a semiconductor device as described above, a positive voltage is applied to the second electrode 40 compared to the first electrode 38, to allow a forward current across the pn-junction. Recombination of electron and positive hole in the p-type ZnO single crystalline layer 34, or the like produces light emission. It is possible to obtain a light having the same energy as an forbidden energy gap from the upper surface of the p-type ZnO single crystalline layer 34. That is, it is possible to use as a light emitting diode.

In the above, although the crystal-growth substrate, the manufacturing method of the ZnO-containing compound semiconductor crystal and the ZnO-containing compound semiconductor device according to the embodiments of the present invention are explained, the present invention is not limited to the embodiments.

For example, when the template layer is provided on the crystal-growth substrate, the template layer can be formed of, beside the GaN single crystal, other compound single crystal having a hexagonal structure such as aluminum nitride (AlN), zinc oxide (ZnO), silicon carbide (6H—SiC, 4H—SiC, 2H—SiC), etc.

In the template layer formed by those single crystal, a plurality of (0001) surfaces (terraces) aligned in a sequence along the direction of the a-axis are formed.

For growing the ZnO single crystal with an improved crystallinity thereon, an angle of the plurality of the terraces formed on the template layer, that is, the angle of the envelope of the terraces and each terrace surface is preferably selected to be in a range of 0.1 to 0.5 degree.

As a material for the template layer, especially single crystal of GaN, AlN, ZnO or 6H—SiC having a hexagonal wurtzite-type crystal structure are appropriate. As a substrate for the base of the template layer, not only the single crystalline sapphire substrate (for example, the sapphire substrate 2 shown in FIG. 2) of which surface has a plurality of (0001) surfaces aligned in a sequence in the direction of m-axis, a single crystal 6H—SiC substrate of which surface has a plurality of (0001) surface aligned in a sequence in the direction of a-axis and the single crystalline sapphire ($\alpha$-Al$_2$O$_3$) substrate having plurality (11–20) surfaces aligned in the direction of the c-axis can be used.

In any substrates, the angle of inclination of the envelope of the terraces with each terrace surface is preferably selected to be in a range of about 0.1 to 0.5 degrees for making the angle of inclination of the terrace of the template layer formed thereon be in a range of 0.1 to 0.5 degrees. The terrace in the substrate for the base of the template layer can be formed by polishing, etching and annealing in an oxygen atmosphere.

In case of making a growth substrate of a single layer structure, without forming a template layer, the growth substrate can be formed of single crystal having a hexagonal wurtzite-type crystal structure such as GaN, AlN, 6H—SiC or the like beside the above-described ZnO single crystal.

In this case, the growth substrate (single crystalline substrate) has a plurality of (0001) surfaces (terraces) aligned along the direction of the a-axis, and it is preferable to grow the ZnO single crystal on these terraces. An angle of inclination of the envelope of the terraces with each terrace surface is preferably selected in a range of 0.1 to 0.2 degrees, and more preferably selected in a range of 0.2 to 1.0 degrees.

In cases of either one of forming the template layer and not forming the template layer, a step between adjacent terraces whereon the ZnO single crystal is grown is preferably one-molecule step or two-molecule step, and if possible, it is preferable to be one-molecule step.

A width (a width in a direction of the angle of inclination in a plan view) of each terrace whereon the ZnO single crystal is grown is preferably about 30 to 150 nm on the template layer or in a range of about 7.5 to 150 nm on the single crystalline substrate without the template layer.

Further, Miller index of the crystalline axis changes in accordance with the crystal structure of the crystal. For example, if the crystal structures of crystals are different, even if the same crystalline axes called "a-axis", the crystalline axes are represented by different Miller index.

By using the n-type ZnO-containing compound semiconductor single crystalline layer and the p-type ZnO-containing compound semiconductor single crystalline layer, it is possible to form various kinds of semiconductor devices such as a light emitting device such as a light emitting diode, a laser oscillator or the like, a circuit device such as an electric field effect transistor, a bipolar transistor or the like, a light receiving device, etc.

It is apparent that various modifications, improvements, combinations, and the like can be made by those skilled in the art.

What is claimed is:

1. A growth substrate comprising a compound single crystal layer of a hexagonal crystal structure having a plurality of (0001) surfaces aligned in a sequence of terraces along a direction of a-axis and adapted for growing, on said compound single crystal layer, a ZnO-containing compound semiconductor single crystal of a hexagonal crystal structure having a growing surface with a normal declined from c-axis toward the direction of the a-axis, wherein said compound single crystal layer is formed of gallium nitride, aluminum nitride, zinc oxide, 2H—silicon carbide, 4H—silicon carbide or 6H—silicon carbide, and said compound single crystal layer is formed on a single crystal sapphire substrate or a single crystal silicon carbide substrate.

2. The growth substrate according to claim 1, wherein said plurality of the (0001) surfaces are aligned in a sequence of terraces at an inclination angle of 0.1 to 0.5 degree with respect to the growing surface.

3. A growth substrate comprising a compound single crystal layer of a hexagonal crystal structure having a plurality of (0001) surfaces aligned in a sequence of terraces along a direction of a-axis and adapted for growing, on said compound single crystal layer, a ZnO-containing compound semiconductor single crystal of a hexagonal crystal structure having a growing surface with a normal declined from c-axis toward the direction of the a-axis wherein said substrate comprises a single layer structure made of said compound single crystal layer, wherein said compound single crystal layer is formed of gallium nitride, aluminum nitride, zinc oxide or 6H—silicon carbide, and said plurality of the (0001) surfaces are aligned along the direction of a-axis at an inclination angle of 0.1 to 2.0 degree with respect to the growing surface.

4. A ZnO-containing compound semiconductor device, comprising:

a growth substrate comprising a compound single crystal layer of a hexagonal crystal structure having a plurality of (0001) surfaces aligned in a sequence of terraces along a direction of a-axis;

a Zno-containing compound semiconductor single crystal layer of a hexagonal crystal structure formed on said compound single crystal layer and having a growth front surface with a normal declined toward the direction of the a-axis; and between said growth substrate and said ZnO-containing compound semiconductor single crystal layer, a zinc oxide buffer layer grown in a direction of zinc (Zn) surface.

5. A method of manufacturing a ZnO-containing compound semiconductor crystal, comprising the steps of:

(a) preparing a crystal-growth substrate comprising a compound single crystal layer of a hexagonal crystal structure having a plurality of (0001) surfaces aligned in a sequence of terraces along a direction of a-axis; and (b) growing a ZnO-containing compound semiconductor single crystal of a hexagonal crystal structure having a growing surface with a normal declined toward the direction of the a-axis on said compound single crystal layer, wherein said crystal-growth substrate
   (i) comprises a growth substrate on which said compound single crystal layer is formed, and said plurality of the (0001) surfaces have an inclination angle of 0.1 to 0.5 degree with respect to the growing surface, or
   (ii) comprises a single layer structure made of said compound single crystal layer, wherein said plurality of the (0001) surfaces have an inclination angle of 0.1 to 2.0 degree with respect to the growing surface.

6. The growth substrate according to claim 1, wherein said terraces form a step height of one or two molecular steps.

7. The growth substrate according to claim 1, wherein said compound single crystal layer has a thickness of 1 to 4 μm.

8. The growth substrate according to claim 1, wherein said sapphire substrate has a plurality of (0001) surfaces aligned in a sequence of terraces along a direction of m-axis.

9. The growth substrate according to claim 2, wherein said inclination angle is 0.1 to 0.3 degrees.

10. The growth substrate according to claim 3, wherein said terraces form a step height of one or two molecular steps.

11. A ZnO-containing compound semiconductor device, comprising:

a growth substrate comprising a compound single crystal structure having a plurality of (0001) surfaces aligned in a sequence of terraces along a direction of a-axis;

a buffer layer made of a ZnO-containing compound semiconductor single crystal grown on the growth substrate in a direction of zinc (Zn) surface, the buffer layer being grown at a first temperature insufficient to grow a single crystal, and then annealed at a second temperature to allow crystallization:

a ZnO-containing compound semiconductor single crystal layer of a hexagonal crystal structure formed on said buffer layer and having a growth front surface with a normal declined toward the direction of a-axis.

12. The growth substrate according to claim 11, wherein said buffer layer has a thickness of 10–40 nm.

13. The growth substrate according to claim 11, wherein said terraces form a step height of one or two molecular steps.

14. The growth substrate according to claim 11, wherein said ZnO-containing compound semiconductor single crystal layer has a thickness of 1 to 4 μm.

15. The growth substrate according to claim 11, wherein said growth substrate comprises a substrate formed of single crystal sapphire or a single crystal silicon carbide.

16. The growth substrate according to claim 11, wherein said sequence of terraces form an envelope having an inclination angle of 0.1 to 0.3 degrees from (0001) surface.

17. A growth substrate comprising a compound single crystal surface of a hexagonal crystal structure having a plurality of (0001) surfaces aligned in a sequence of terraces along a direction of a-axis, wherein said compound single crystal surface is formed of gallium nitride, aluminum nitride, zinc oxide, or silicon carbide, and said sequence of terraces form an envelope at an angle of 0.1 to 0.5 degrees from (0001) surface.

18. A growth substrate comprising a compound single crystal body of an hexagonal crystal structure having a plurality of (0001) surfaces aligned in a sequence of terraces along a direction of a-axis, wherein said compound single crystal body is formed of gallium nitride, aluminum nitride, zinc oxide, or silicon carbide; and said sequence of terraces form an envelope at an angle of 0.1 to 2.0 degrees from (0001) surface.

19. A method of manufacturing a semiconductor device comprising the steps of:

(a) preparing a crystal growth substrate having a compound semiconductor single crystal surface of a hexagonal crystal structure having a plurality of (0001) surfaces aligned in a sequence of terraces along a direction of a-axis, the sequence of terraces forming an envelope forming an angle in a range of 0.1 to 2.0 degrees from (0001) surface;

(b) growing a ZnO-containing compound semiconductor single crystal layer of a hexagonal crystal structure having a growing surface with a normal declined from c-axis toward the direction of a-axis on said compound semiconductor single crystal surface;

(c) doping impurity into said ZnO-containing compound semiconductor single crystal layer.

20. The method of manufacturing a semiconductor device according to claim 23, wherein said step (b) comprises the steps of:

(b-1) growing a first ZnO-containing compound semiconductor layer at a first temperature insufficient to grow a single crystal layer, (b-2) annealing the first ZnO-containing compound semiconductor layer at a second temperature higher than the first temperature, to crystallize the first ZnO-containing compound semiconductor layer, (b-3) growing a second ZnO-containing compound semiconductor layer, in single crystal phase, at a third temperature higher than the first temperature, on said first ZnO-containing compound layer.

* * * * *